United States Patent [19]

Reyes

[11] Patent Number: 4,465,894
[45] Date of Patent: Aug. 14, 1984

[54] SUBSTRATELESS THERMOELECTRIC DEVICE AND METHOD OF MAKING SAME

[75] Inventor: Jaime M. Reyes, Birmingham, Mich.

[73] Assignee: ECD-ANR Energy Conversion Company, Troy, Mich.

[21] Appl. No.: 482,826

[22] Filed: Apr. 7, 1983

[51] Int. Cl.$^3$ .............................................. H01L 35/28
[52] U.S. Cl. ...................... 136/225; 29/573; 136/201; 136/211; 136/212; 136/224
[58] Field of Search ............. 136/202, 218, 224, 237, 136/238, 201, 211, 212, 225; 29/573

[56] References Cited

U.S. PATENT DOCUMENTS

| | | | |
|---|---|---|---|
| 3,899,359 | 8/1975 | Stachurski | 136/218 X |
| 3,923,551 | 12/1975 | Purdy | 136/237 X |
| 4,006,039 | 2/1977 | Purdy | 136/237 |

Primary Examiner—Leland A. Sebastian
Attorney, Agent, or Firm—Lawrence G. Norris

[57] ABSTRACT

A new and improved thermoelectric device of the type which provides electrical energy in response to a temperature gradient applied across the device exhibits both structural integrity and improved efficiency. The new thermoelectric device includes a plurality of thermoelectric elements, coupling means on opposite respective sides of the thermoelectric elements for interconnecting the elements electrically in accordance with a predetermined pattern, and encapsulant means including an encapsulant material covering the exposed surfaces of the thermoelectric elements. The encapsulant forms void spaces between the elements for providing effective thermal insulation between the elements and confining substantially all of the heat flow from the temperature gradient to through the elements. The coupling means includes electrically conductive plate segments for electrically interconnecting the thermoelectric elements. The plate segments are joined to the elements on respective opposite sides thereof and are contacted and held in fixed relative relation by the encapsulant material. The plate segments further define an outer periphery of the device and the encapsulant material bridge across the plate segments at the periphery of the device. As a result, structural device integrity is obtained while more efficient use of the temperature gradient is made.

21 Claims, 6 Drawing Figures

SUBSTRATELESS THERMOELECTRIC DEVICE AND METHOD OF MAKING SAME

BACKGROUND

The present invention relates to a new and improved thermoelectric device for the generation of electricity.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new thermoelectric devices which provide more electricity.

An important part of the solution with respect to the development of permanent, economical energy conversion lies in the field of thermoelectrics wherein electrical power is generated by heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level.

The efficiency of a thermoelectric device can be expressed in terms of a figure of merit (Z) for the material forming the device, the equation defining Z is:

$$Z = S^2 \sigma / K$$

Where:

Z is expressed in units $\times 10^3$
S is the Seebeck coefficient in $\mu V/°C$.
K is the thermal conductivity in $mW/cm - °C$. and
$\sigma$ is the electrical conductivity in $(\Omega - cm)^{-1}$.

From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_1$, the lattice component; and $K_e$, the electrical component. In non-metals, $K_1$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. $+150°$ C. range with its best Z appearing at around $30°$ C. $(Bi,Sb)_2Te_3$ represents a continuous solid solution system in which the relative amounts of Bi and Sb are from 0 to 100%. The Si-Ge material is best suited for high temperature applications in the $600°$ C. to $1000°$ C. range with a satisfactory Z appearing at above $700°$ C. The PbTe polycrystalline material exhibits its best figure of merit in the $300°$ C. to $500°$ C. range. None of these materials is well suited for applications in the $100°$ C. to $300°$ C. range. This is indeed unfortunate, because it is in this temperature range where a wide variety of waste heat applications are found. Among such applications are geothermal waste heat and waste heat from internal combustion engines in, for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in copending U.S. application Ser. No. 412,306, filed Aug. 27, 1982 in the names of Tumkur S. Jayadev and On Van Nguyen for NEW MULTIPHASE THERMOELECTRIC ALLOYS AND METHOD OF MAKING SAME, allowed Sept. 26, 1983 and U.S. application Ser. No. 414,917, filed Sept. 3, 1982 in the names of Tumkur S. Jayaev, On Van Nguyen, Jaime M. Reyes, Helen Davis and Michael W. Putty for NEW POWDER PRESSED THERMOELECTRIC MATERIALS AND METHOD OF MAKING SAME, which applications are incorporated herein by reference.

The thermoelectric materials there disclosed can be utilized in the device herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially affecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforesaid referenced applications, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pats. 4,177,473, 4,177,474, and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofore mentioned independently increased electrical conductivities. In contrast, the materials disclosed in the aforementioned referenced applications are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

Thermoelectric devices generate electricity by the establishment of a temperature differential across the materials contained therein. They generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

Thermoelectric power conversion has not found wide usage in the past not only because of material limitations but also because of device limitations. Among the device limitations are bowing or warping of device substrates, loss of broad surface contact between the device and a heat exchanger when utilized in a thermoelectric system and temperature losses across the substrates.

Thermoelectric devices of the prior art use copper lead patterns placed upon a ceramic substrate for the attachment of thermoelectric elements thereto. In the manufacture of these devices, a second ceramic substrate having another copper lead pattern is sweated onto the thermoelectric elements. In the sweating process, a layer of solder or brazing alloy is applied to the members being joined, by methods such as stenciling a granular paste thereonto, and the assembly is heated to a temperature sufficient to fuse the solder or brazing alloy and thereby join the elements. Due to the difference in the coefficient of thermal expansion between the ceramic substrates and the copper lead patterns, there occurs a bowing or warping of the substrates during the sweating operation which causes a number of related problems.

First, because of the warping of the substrates, it is difficult if not impossible to obtain a good thermal connection between the elements and the copper lead patterns of the substrates. Additionally, because the ceramic substrates are brittle, the bowing or warping, if severe enough, can cause cracking of the substrates and other physical degradation of the devices. Furthermore, to be employed in a thermoelectric system, the outer surfaces of the substrates must make intimate broad surface contact with a heat exchanger. The warping or bowing of the substrates also makes proper connection between the devices and a heat exchanger difficult.

To overcome these problems, the forces imparted to the substrates caused by the difference in the coefficients of thermal expansion between the copper lead patterns and the ceramic substrates are equalized by applying copper in substantially identical patterns as the lead patterns to the other side of the substrates. Unfortunately, the additional copper increases the material cost of the devices and adds extra processing steps to their manufacture. Furthermore, the degree of abatement of thermal stress obtained by this process is still not satisfactory.

During the operation of thermoelectric devices, a temperature differential is applied across the device to generate electricity. Due to the difference in the coefficient of thermal expansion between the substrates and the thermoelectric elements, loss of broad surface contact occurs between the device and the heat exchanger when utilized in a thermoelectric system. This loss of broad surface contact results in less heat transfer which translates to a lower temperature differential across the device, and lower efficiency of the device.

It has also been found that a substantial temperature drop occurs across the ceramic substrates. The voltage output and the current of a thermoelectric element is proportional to the temperature differential across the element. Therefore, the power is proportional to the square of the temperature differential, and any change in temperature differential across the elements has a substantial effect on the power output of the device. As a result, the temperature drop across the substrates reduces the temperature differential otherwise available to the elements for power generation. Further, the additional copper used to overcome the warping problems adds additional temperature losses across the substrates. These losses undesirably decrease the temperature differential across the thermoelectric elements from the temperature differential available across the devices thereby adversely decreasing the power output of the devices.

Because of these problems, thermoelectric devices of the prior art often failed during operation due to cracking of thermoelectric connections and fracture of the substrate. Furthermore, warpage and loss of broad surface contact results in lower heat transfer which translates into a lower temperature differential across the device and therefore, a lower overall efficiency.

In an attempt to overcome these problems, a substrateless device has been proposed. This device and method of fabrication thereof is disclosed and claimed in co-pending U.S. application Ser. No. 372,688, filed Apr. 28, 1982, in the name of Der-Jeou Chou for IMPROVED THERMOELECTRIC DEVICE AND METHOD OF MAKING SAME, allowed Mar. 7, 1984, which application is also incorporated herein by reference. The device disclosed therein has no substrates and no compensating elements. Consequently, thermal losses normally resulting from these components are eliminated. Furthermore, the disclosed device exhibits a lower degree of thermal stress because the thermoelectric generating elements are flexibly held together by a plurality of conductive interconnecting members and a potting compound filling the voids between the elements. This structure results in a device having a high degree of flexibility. Although the efficiency of this device is high, performance under many circumstances leaves much to be desired. Unfortunately, the interconnect members and the potting compound between the elements provide the device with only limited structural integrity and, consequently, it is not rugged enough under some circumstances to withstand mechanical vibration during handling, installation or use which of course limits the utility of this device.

Other thermoelectric devices which provide both structural reliability and high efficiency are disclosed in copending U.S. application Ser. No. 470,154, filed Feb. 28, 1983, in the names of Der-Jeou Chou and Donald L. Heath for THERMOELECTRIC DEVICE EXHIBITING DECREASED STRESS which application is assigned to the assignee of the present invention. The thermoelectric devices there disclosed are capable of withstanding mechanical stress resulting from its use in systems presenting a high degree of vibration or mechanical shock such as in internal combustion engines or the like, and which exhibit a low degree of thermal stress when a temperture gradient is applied thereto. The devices thereby eliminate problems of damage and poor heat transfer while exhibiting decreased thermal losses, thereby fully exploiting the improved thermoelectric characteristics of the new and improved thermoelectric materials previously mentioned and disclosed in U.S. applications 412,306 and 414,917. These thermoelectric devices include one rigid substrate upon which the thermoelectric elements and their accompanying interconnect means are rigidly mounted, thereby providing a unitary, rugged structure and one floating substrate. In addition, the devices include means for relieving thermal stress, so that substrate warpage and consequent poor heat transfer and device failure are eliminated. In addition, the stress relieving means obviates the need for stress compensating copper bars thereby eliminating the efficiency losses associated with such components. In one of the devices disclosed in the above-mentioned application, the floating substrate can be eliminated completely thereby further decreasing thermal losses and increasing efficiencies.

As will be demonstrated hereinafter, the new and improved thermoelectric devices of the instant invention represent further advances to overcome the problems of the prior art. Mechanical strength is obtained, while improved efficiencies and power output are possible as a result of more efficient use of the temperature differential applied across the devices.

SUMMARY OF THE INVENTION

The present invention provides a new and improved thermoelectric device of the type which provides electrical energy in response to a temperature gradient applied across the device. The device exhibits both structural integrity and improved efficiency. The new thermoelectric device includes a plurality of thermoelectric elements, coupling means on opposite respective sides of the thermoelectric elements for interconnecting the elements electrically in accordance with a predetermined pattern, and encapsulant means including an encapsulant material covering the exposed surfaces of the thermoelectric elements and forming void spaces between the elements for providing effective thermal insulation between the elements and confining substantially all of the heat flow from the temperature gradient to through the elements.

In accordance with one embodiment of the invention, the coupling means include electrically conductive plate segments for electrically interconnecting the thermoelectric elements. The plate segments are joined to the elements on respective opposite sides thereof and are contacted and held in fixed relative relation by the encapsulant material. The plate segments further define an outer periphery of the device and the encapsulant material bridge across the plate segments at the periphery of the device. As a result, structural device integrity is obtained while more efficient use of the temperature gradient is made.

The invention also provides a method of making a new and improved thermoelectric device of the type which provides electrical energy in response to an applied temperature gradient, which device provides increased energy conversion efficiency. The method includes the steps of providing a plurality of thermoelectric elements, connecting the elements electrically together in a predetermined relation, and thereafter, coating the exposed surfaces of the elements with an insulating material to leave void spaces remaining between the elements. The void spaces provide effective thermal insulation between the elements and confine substantially all of the heat flow through the device from the temperature gradient to through the elements.

BRIEF DESCRIPTIONS OF THE DRAWINGS

DETAILED DESCRIPTION

In accordance with the present invention the new and improved thermoelectrc device and method for making the same shall now be described with reference to the drawings.

Referring now to FIGS. 1–4, a thermoelectric device 10 embodying the present invention is there illustrated. The device 10 includes a plurality of p-type thermoelectric elements 12 and a plurality of n-type thermoelectric elements 14 arranged in spaced apart relations. The device generates electricity by the establishment of a temperature gradient thereacross which drives flux through the p-type and n-type thermoelectric elements 12 and 14. In the n-type elements 14, the temperature gradient drives negative carriers from the hot side to the cold side. In the p-type elements 12, the temperature gradient drives positive carriers from the hot side to the cold side. It is the movement of the positive and negative carriers which generates electricity.

Figure 1:
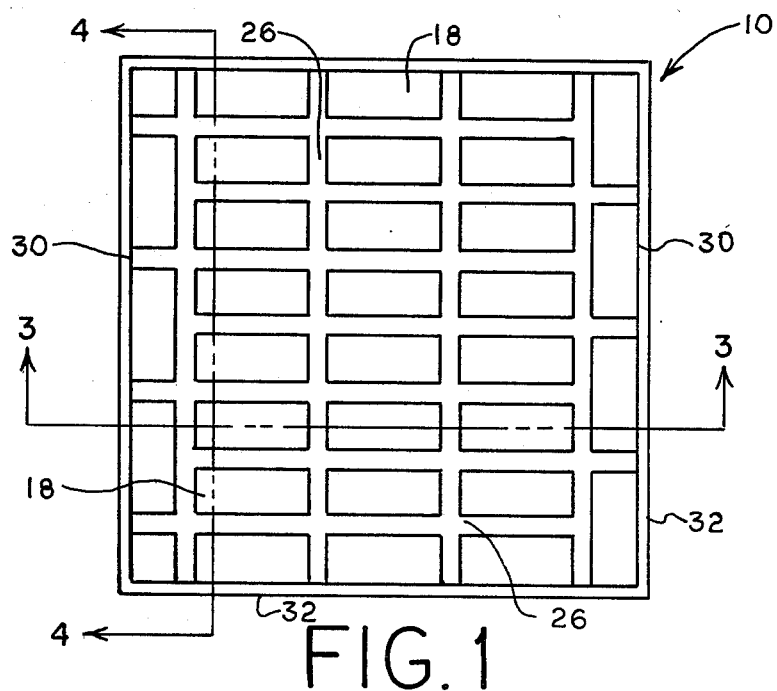
FIG. 1 is a top plan view of a thermoelectric device embodying the present invention.
Figure 2:
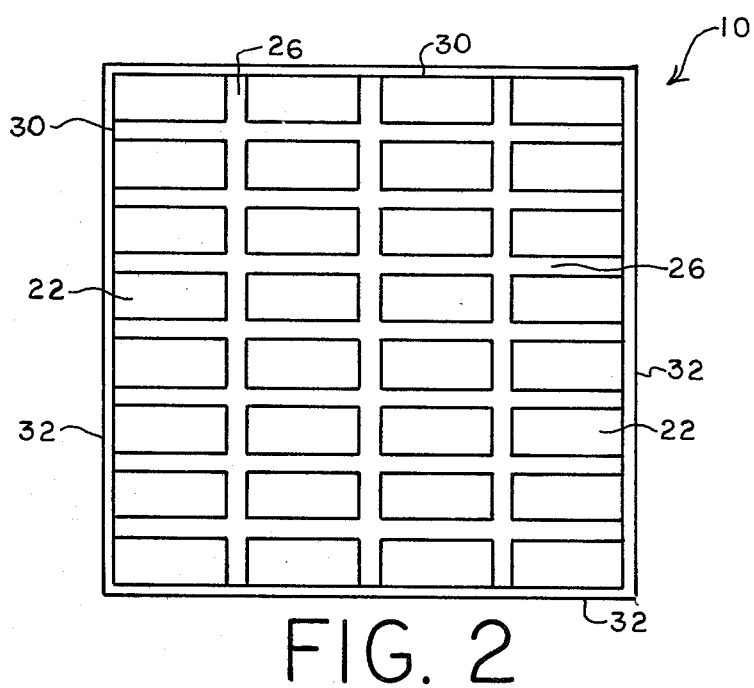
FIG. 2 is a bottom plan view of the device of FIG. 1.
Figure 3:
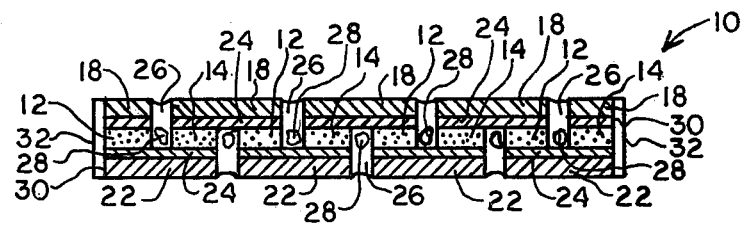
FIG. 3 is a cross-sectional view taken along lines 3—3 of FIG. 1.
Figure 4:
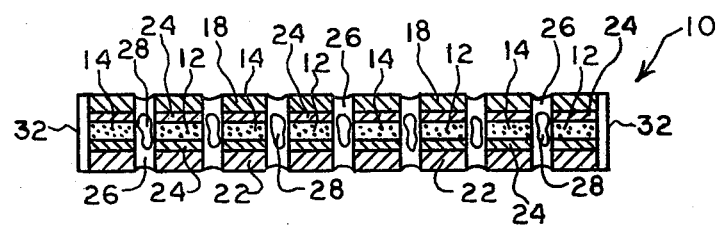
FIG. 4 is a cross sectional view taken along lines 4—4 of FIG. 1.

The p-type and n-type thermoelectric elements 12 and 14 are equal in number and alternate throughout as best shown in FIG. 3. As contemplated by this embodiment, the device 10 includes thirty-two p-type elements 12 and thirty-two n-type elements 14 by way of example only. Any equal number of p-type and n-type elements will suffice. The elements 12 and 14 can be formed as disclosed and claimed in the aforementioned copending U.S. application Ser. No. 414,917, filed Sept. 3, 1982, for New Powder Pressed Thermoelectric Materials and Method of Making Same, which application is assigned to the assignee of the present invention and incorporated herein by reference.

The thermoelectric device 10 also includes a plurality of spaced apart first and second sets of conductive plate segments 22 and 18 respectively. The conductive plate segments 18 and 22 can be formed from copper, for example, and connect the elements 12 and 14 electrically in accordance with a predetermined pattern. The interior surfaces of the copper plate segments 18 and 22 have a solder 24 applied thereto for forming a good, low resistance thermal and electrical joint between the elements 12 and 14 and the copper plate segments 18 and 22. The copper plate segments 18 and 22 are arranged to define a lead pattern for connecting the elements 12 and 14, for example, electrically in series and thermally in parallel.

Covering the exposed surfaces of the elements, the surfaces not in contact with the solder 24, is an encapsulant material 26 such as a high temperature epoxy such as a polyimide. One epoxy which can be used is epoxy type 353ND EPOXY TECHNOLOGY, INC., 14 Fortune Dr., Billerica, Mass., 01821. The encapsulant has qualities of high electrical and thermal resistivity to insulate the elements and to protect the elements from contamination. The encapsulant 26 forms void spaces 28 between the elements 12 and 14. Since air is a good thermal insulator, in fact, better than most potting or encapsulant materials, more effective thermal insluation is provided between the elements. This is extremely important because the heat will flow through the device by virtue of the temperature gradient across the device. To maximize the power out of the device, and thus the efficiency, as much of that heat flow as possible should flow through the elements. Because of the highly effective thermal insulation provided between the elements by the void spaces, substantially all of the heat flow through the device is confined to flow through the elements.

Figure 5:
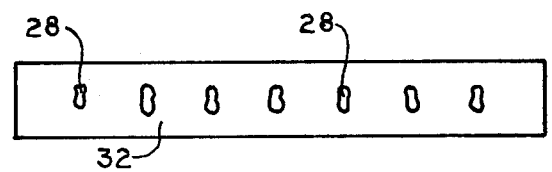
FIG. 5 is a side plan view of the thermoelectric device of FIG. 1.

The encapsulant serves a further function. As can be noted in the figures, the copper plate segments 18 and 22 are spaced apart. The encapsulant 26 contacts the peripheral side surfaces of the copper segments and maintains the copper segments 18 and 22 in fixed relative position. In this manner, the structural integrity of the device is improved. In addition, the copper segments are arranged to define a periphery 30 of the device 10 before the application of the encapsulant 26. As will be described hereinafter, as the encapsulant is applied, it will run down the sides of the copper segments 18 and 22 and the elements 12 and 14 at the outside margins of the device. The device sides will then appear as illustrated in FIG. 5. Once hardened, the encapsulant bridges across the periphery 30 of the device 10 from the copper segments on one side of the device to the copper segments on the other side of the device. These bridges 32 formed by the encapsulant, together with the encapsulant filling the spaces between the copper segments and coating the elements, provides extremely high structural integrity of the device. It can also be noted that the device is made strong and extremely shock resistant without the need of continuous ceramic or other substrates as previously referred to. Hence, the losses attributable to such components is eliminated.

Figure 6:
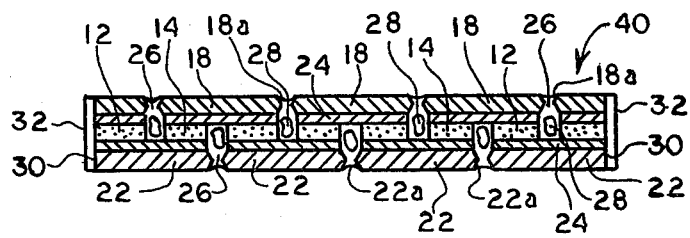
FIG. 6 is a cross-sectional side view similar to FIG. 3 of another thermoelectric device embodying the present invention.

Referring now to FIG. 6, it illustrates in side crossectional view another device 40 embodying the present invention. This device 40 is substantially identical to device 10 and hence like reference numerals are utilized for identical components. The device 40, like device 10, includes first and second sets of conductive plate segments 18 and 22, a plurality of p-type and n-type elements 12 and 14, and solder 24 joining the elements to the plate segments. The device 40 also includes the encapsulant 26 which covers the exposed surfaces of the elements 12 and 14 forming thermally insulating void spaces 28. The encapsulant also physically binds the plate segments 18 and 22 together within the planes of the respective major sides of the device, and bridges across the periphery 30 of the device to form bridges 32. As a result, the device 40 possesses all of the advantages in terms of strength and energy conversion efficiency as device 10 of FIG. 1. In addition however, it can be noted that the plate segments 18 and 22 have tapered peripheral surfaces 18a and 22a. These tapered surfaces or edges serve to lockingly engage the encapsulant 26 to further increase the strength of the device. Alternatively, the peripheral surfaces of the plate segments 18 and 22 can be inwardly arcuate or concave to lockingly engage the encapsulant 26.

The devices 10 and 40 can be made in accordance with the present invention by first providing the elements 12 and 14 and plate segments 18 and 22. Thereafter, the plate segments and elements are joined with the solder 24. The device is then placed into an open container having an inner dimension defined by sidewalls which are parallel to and slightly spaced from the periphery 30 of the devices. Then, the encapsulant material such as a polyimide is flowed by spraying or the like over the device. This coats the exposed surfaces of the elements on one side of the device and the periphery 30 of the device. The amount of encapsulant flowed over the device is chosen so that the residual encapsulant which accumulates in the bottom of the container will acquire a depth substantially equal to the thickness of the plate segments 18 and 22. As a result, once the volatile carrier of the encapsulant evaporates, the plates 18 or 22 of that side will be physically joined by the encapsulant.

Next, the device is turned over in the container and the above process is repeated. Then the major surfaces of the device are lapped to polish the exposed or outer surfaces of the plate segments.

In addition to the foregoing a filler material such as glass particles can be incorporated into the encapsulant. This not only makes the encapsulant stronger, but additionally allows the coefficient of thermal expansion of the encapsulant to be matched to the coefficient of thermal expansion of the elements 12 and 14 and the plate segments 18 and 22. One glass filler which can be used are in the form of hollow glass spheres of the type FA-A available from W. R. Grace and Company, Canton, Mass., 02021.

From the foregoing, it can be appreciated that the present invention provides a new and improved thermoelectric device. The devices are not only substrateless, eliminating the thermal losses due to substrates, but additionally improve upon the efficiency of prior art substrateless thermoelectric devices by establishing the void spaces 28 between the thermoelectric elements and thus increasing the thermal insulation between the elements and the utilization of the temperature gradient applied across the devices. In addition, while efficiency has been increased, the physical strength and integrity of the devices have not been compromised but in fact improved. This improvement is the result of the encapsulant 26 being between the peripheral surfaces or edges of the plate segments 18 and 22 to physically maintain their relative position and by the encapsulant forming the bridges 32 at the periphery of the devices between the opposite major sides of the devices.

Modifications and variations of the present invention are possible in light of the above teachings. It is therefore, to be understood that within the scope of the appended claims the invention may be practiced otherwise than as specifically described.

I claim:

1. A thermoelectric device of the type which provides electrical energy in response to a temperature gradient applied across the device, said device providing increased conversion efficiency and comprising:
   a plurality of thermoelectric elements arranged in spaced apart relation;
   coupling means for electrically coupling said elements in a predetermined pattern; and
   encapsulant means including an encapsulant material covering the exposed surfaces of said elements, said encapsulant forming void spaces between said elements for providing effective thermal insulation between said elements and confining substantially all of the heat flow from said temperature gradient to through said elements.

2. A device as defined in claim 1 wherein said encapsulant material also contacts said coupling means for maintaining said coupling means in fixed positional relation.

3. A device as defined in claim 2 wherein said coupling means defines respective opposite major sides and peripheral minor sides of said device and wherein said encapsulant material bridges across said coupling means at said peripheral sides of said device for providing said device with structural integrity.

4. A device as defined in claim 3 wherein said coupling means comprises first and second sets of conductive plate segments electrically coupled to opposite respective sides of said elements, wherein each said plate segment includes peripheral surface portions, and wherein said encapsulant material contacts said peripheral surface portions.

5. A device as defined in claim 4 wherein at least one of said plate segments includes a peripheral surface arranged for lockingly engaging said encapsulant material.

6. A device as defined in claim 5 wherein said at least one peripheral surface is tapered.

7. A device as defined in claim 5 wherein said at least one peripheral surface is concave.

8. A device as defined in claim 1 wherein said elements and said coupling means have a thermal coefficient of expansion, and wherein said encapsulant material includes a filler material for matching the thermal coefficient of expansion of said encapsulant to the thermal coefficient of expansion of said coupling means and said elements.

9. A device as defined in claim 8 wherein said filler material is glass.

10. A device as defined in claim 1 wherein said encapsulant material is a polyimide.

11. A device as defined in claim 1 wherein said encapsulant material is epoxy.

12. A thermoelectric device of the type which provides electrical energy in response to a temperature gradient applied across the device, said device comprising:
    a plurality of thermoelectric elements arranged in spaced apart relation;
    coupling means for electrically coupling said elements in a predetermined pattern and being disposed on respective opposite sides of said elements to define respective opposite major sides and peripheral minor sides of said device; and
    encapsulant means including an encapsulant material bridging across said peripheral minor sides of said device between said coupling means for binding said coupling means together and providing said device with improved structural strength.

13. A device as defined in claim 12 wherein said coupling means include peripheral surface portions and wherein said encapsulant means extend between said peripheral surface portions of said coupling means for binding said coupling means together in the plane of said major sides of said device.

14. A device as defined in claim 13 wherein said encapsulant material covers the exposed surfaces of said elements and forms void spaces between said elements for providing effective thermal insulation between said elements and confining substantially all of the heat flow through said device from said temperature gradient to through said elements.

15. A device as defined in claim 13 wherein at least some of said peripheral surface portions of said coupling means are arranged for lockingly engaging said encapsulant material.

16. A device as defined in claim 13 wherein at least some of said peripheral surface portions of said coupling means are tapered for lockingly engaging said encapsulant material.

17. A device as defined in claim 13 wherein at least some of said peripheral surface portions of said coupling means are concave for lockingly engaging said encapsulant material.

18. A method of making a new and improved thermoelectric device of the type which provides electrical energy in response to an applied temperature gradient, said device providing increased energy conversion efficiency, said method comprising the steps of:
providing a plurality of thermoelectric elements;
connecting said elements electrically together in a predetermined relation; and thereafter,
coating the exposed surfaces of said elements with an insulating material to leave void spaces remaining between said elements to provide effective thermal insulation between said elements and to thereby confine substantially all of the heat flow through said device from said temperature gradient to through said elements.

19. A method as defined in claim 18 including the further steps of providing a plurality of conductive plate segments having at least one major surface and peripheral minor surfaces; joining said elements to said segment major surfaces to connect said elements electrically in said predetermined relation; and joining said segments together between said peripheral minor surfaces with said insulating material.

20. A method as defined in claim 19 wherein said step of joining said segments together between said minor surfaces is performed as said elements are coated.

21. A method as defined in claim 19 wherein said step of joining said elements to said segments includes arranging said segments to define the outer periphery of said device and joining said segments to opposite respective sides of said elements, and including the further step of coating the outer periphery of said device with said insulating material between said segments joined to said opposite sides of said elements.

* * * * *

UNITED STATES PATENT AND TRADEMARK OFFICE
CERTIFICATE OF CORRECTION

PATENT NO. : 4,465,894

DATED : August 14, 1984

INVENTOR(S) : Jaime M. Reyes

It is certified that error appears in the above-identified patent and that said Letters Patent is hereby corrected as shown below:

Abstract, line 16, delete "includes" and insert --include--;
Col. 2, line 39, after "1983" insert --,--;
Col. 2, line 41, delete "Jayaev" and insert --Jayadev--;
Col. 5, line 59, delete "temperture" and insert --temperature--;
Col. 7, line 3, after "cross" insert -- - --;
Col. 7, line 9, delete ";" and insert --.--;
Col. 7, line 13, delete "thermoelectrc" and insert --thermoelectric--;
Col. 7, line 68, delete "insluation" and insert --insulation--; and
Col. 8, lines 36 and 37, delete "Cros-ssectional" and insert --Cross-sectional--.

Signed and Sealed this

Fifth Day of March 1985

[SEAL]

Attest:

DONALD J. QUIGG

Attesting Officer     Acting Commissioner of Patents and Trademarks